United States Patent [19]

Melero

[11] Patent Number: 4,750,264

[45] Date of Patent: Jun. 14, 1988

[54] METHOD FOR FABRICATING AN ELECTRONIC CIRCUIT

[76] Inventor: Pedro V. Melero, 27, Marqués de Lozoya Street, 28007 Madrid, Spain

[21] Appl. No.: 804,506

[22] Filed: Dec. 4, 1985

[30] Foreign Application Priority Data

Dec. 5, 1984 [ES] Spain .................................... 538.302
Jun. 7, 1985 [ES] Spain .................................... 544.000

[51] Int. Cl.⁴ .......................... H05K 3/30; B23P 19/04
[52] U.S. Cl. ........................................ 29/837; 29/750; 29/833; 434/224
[58] Field of Search ................. 29/832, 833, 837, 750; 434/224, 301; 33/1 B; 282/28 R, 28 A, 22, 8

[56] References Cited

U.S. PATENT DOCUMENTS

| | | | |
|---|---|---|---|
| 398,675 | 2/1889 | Thompson | 282/28 R |
| 2,882,618 | 4/1959 | Thompson | 434/224 |
| 3,564,480 | 2/1971 | Dziubaty | 434/301 |
| 3,621,554 | 11/1971 | Feldman et al. | 434/224 |
| 4,229,887 | 10/1980 | Lukits | 434/224 |
| 4,614,363 | 9/1986 | Breen | 282/22 |

*Primary Examiner*—P. W. Echols
*Attorney, Agent, or Firm*—Marks Murase & White

[57] ABSTRACT

A procedure and apparatus for preparing an electronic baseboard are disclosed. The baseboard is marked such that each side shows the specific location for various circuit elements and their corresponding connections. The components are inserted into holes in the base board and are connected by means of a wiring device. The wiring device includes a tubular hollow body which houses an electrical conductor wire. A reel is rotatably attached to one end of the hollow body. The electrical conductor wire is wound on the rotatable reel, runs axially through the hollow body and emanates through a nozzle at a second end of the device. The device is optionally provided with a blade for cutting the electrical conductor wire.

4 Claims, 4 Drawing Sheets

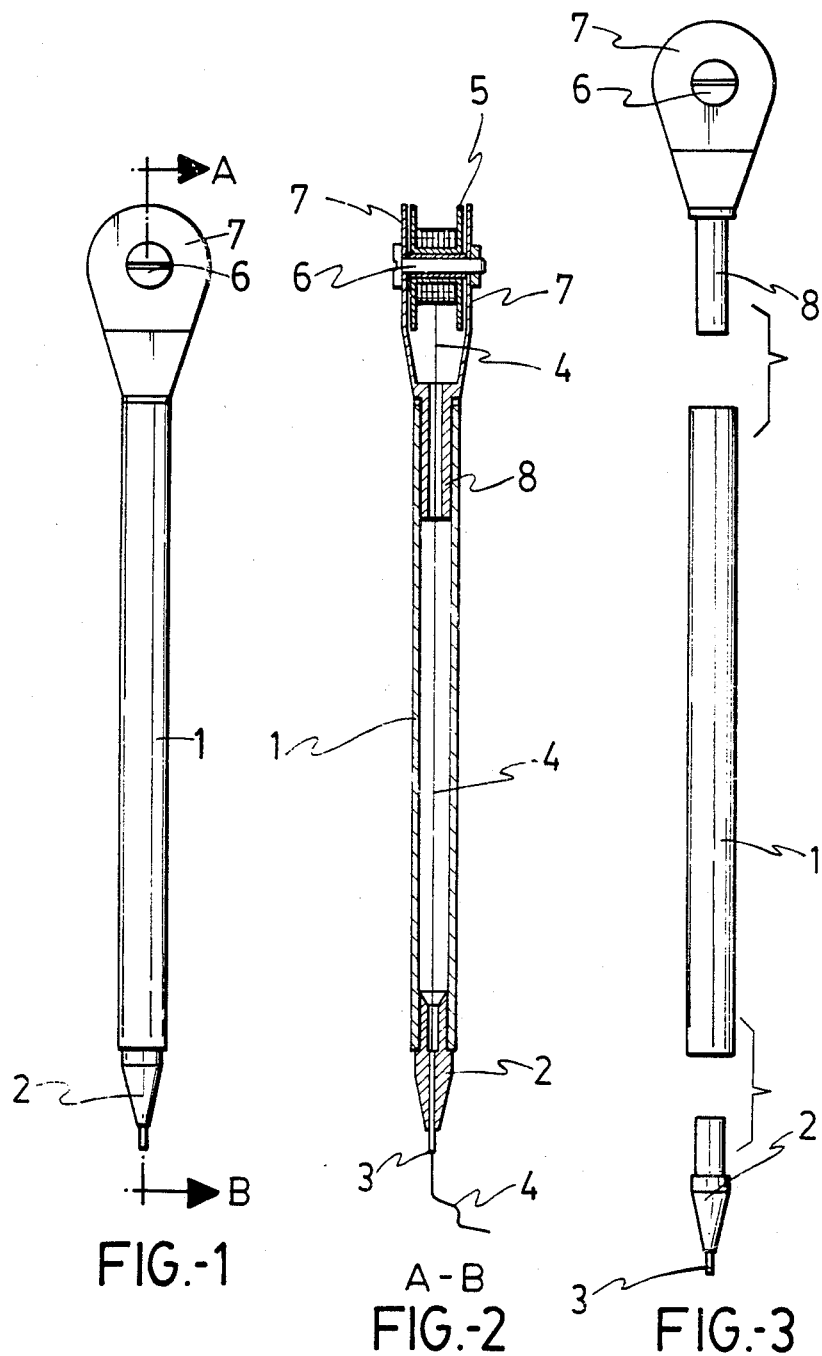

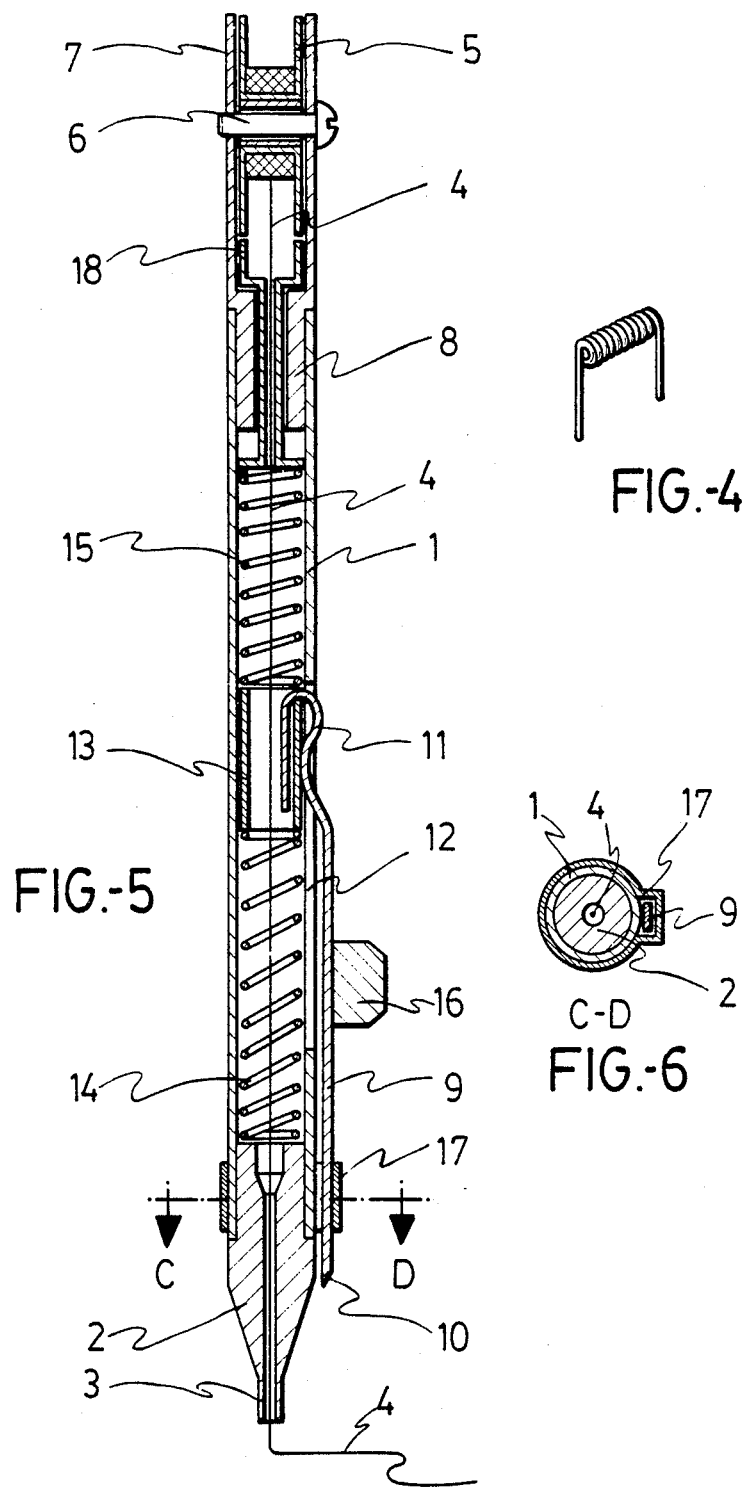

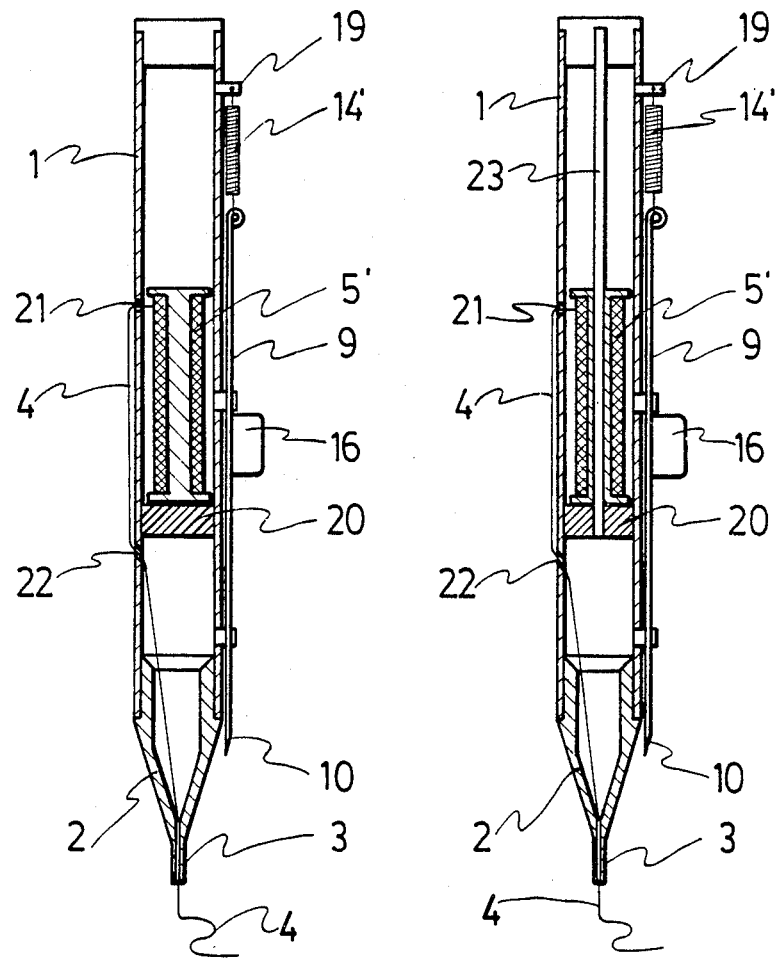

METHOD FOR FABRICATING AN ELECTRONIC CIRCUIT

BACKGROUND OF THE INVENTION

This invention pertains to a new procedure for fabricating electronic circuits, especially applicable to the design of experimental circuits and prototypes, and by means of which it is feasible to secure such circuits in a manner which is economical, rapid and efficient.

The invention also pertains to a device, tool or component for the practical application of the said procedure.

As is well-known, in an electronic circuit, several discrete elements are typically involved, such as resistors, condensors, transistors, integrated circuits, etc., which must be correctly interconnected so that the circuit will fulfill the function for which it has been designed. To this end, use is made of electrically insulating printed circuit boards, at least one surface of which is covered in a conductive material, normally copper. The conductive material is subjected to serigraphic processes and chemical manipulation in order to eliminate part of the conductive material and to define interconnection traces between the various points provided for the location of the components, where openings are made for the fixing thereof, by means of their connection pins.

This solution is obviously entirely satisfactory in circuit fabrication which is highly repetitive, in other words, those which are to be mass produced, This is no longer the case, however, when dealing with experimental circuits or prototypes where, on the one hand, the printed circuit board may be unique and, on the other hand, it may be necessary to alter connections once they have been completed.

SUMMARY OF THE INVENTION

The present invention permits fabrication of such circuits in a more fully satisfactory manner. The procedure of the invention also employs an electrically insulating base plate, but in this case without any type of electrically conductive covering. On the base plate the appropriate perforations are made for securing the discrete components, which are then fitted onto the board in accordance with the distribution designed for the particular purpose. Connection is then carried out with a conductive wire which, according to the density of the wiring may be bare, or sheathed if density is high. Provision is made for multiple crossovers between the wires.

From the foregoing, it can be deduced that an electronic circuit made in accordance with the procedure in this invention makes it possible to introduce all types of modifications in experimental circuits, without the slightest risk of damage to the discrete components, which may be re-used for subsequent assemblies. Therefore, such a procedure is not only particularly suitable for industrial circuits of experimental type, but also for teaching and purposes for practical classes in electronics, in all events considerably simplifying the preparation of the circuits.

For the practical application of the procedure, a device has been designed which is made up basically of an extended body, similar to a writing implement, and which can be handled as such. The body is hollow and is fitted with a distributor tip through which the connecting wire is precisely guided, from a reel which is attached to its other end, so that a wire tip is roll-fixed to one of the pins of any of the components. From there, the movement of the device, as if the operator were "drawing", pulls the wire progressively out from the feed reel and marks out the route designed for the wire until it reaches a new component.

On the basis of this fundamental structure of the device, it is feasible for the wire feed reel to be located at the opposite end from the operation, as pointed out, on a transverse axis so that the wire runs directly and axially into the inside of the body, or else for the reel to be located inside the body, on a lengthwise axis, in which case the wire would emerge radially from the body, through an opening made for this purpose, then re-entering the body and running to the guide tip which is, of a diameter to suit the wire itself.

In order to facilitate the wire cutting operation, provision has been made for the device described to be assisted by a blade, preferably located on the outside surface of the body, along one of its generatrices, and which can be frontally displaced against the tension of a recovery spring aligned with the blade itself. Alternatively, the blade may be housed inside the body, in which case the blade must cross the body in order to come into contact with the mount, through a slit window which permits longitudinal movement of the blade.

BRIEF DESCRIPTION OF THE DRAWINGS

As a complement to this description, and in order to assist in a better understanding of the characteristics of the invention, reference is made to the drawings, forming an integral part in which:

FIG. 1 is a side elevation view of a device for the wiring of an electronic circuit in accordance with the procedure of the present invention;

FIG. 2 is a diametric cross-section of the same device, taken along line A-B of FIG. 1;

FIG. 3 is a further lateral elevated view of the same device, in an exploded view;

FIG. 4 is a perspective view of an auxiliary part which is provided for inclusion in the circuit at the points where components must be introduced or extracted;

FIG. 5 is a cutaway view of a variant in the design of the wiring device shown in FIGS. 1-3, but also including a cutting blade and recovery spring for the blade;

FIG. 6 is a transverse cross-section of the device which is shown in FIG. 5, along the plane C-D of that figure;

FIG. 7 is a cutaway view of a further variation in the design of the wiring device, where the wire feed reel has been placed in a different arrangement and the blade is assisted by a recovery spring which is installed outside the body; and FIG. 8 is a cutaway view of a device similar to that of FIG. 7, except that the reel is assisted by a shaft which helps it to turn and which enables it to slide axially.

DETAILED DESCRIPTION OF THE PREFERRED EMBODIMENTS

Figure 9:
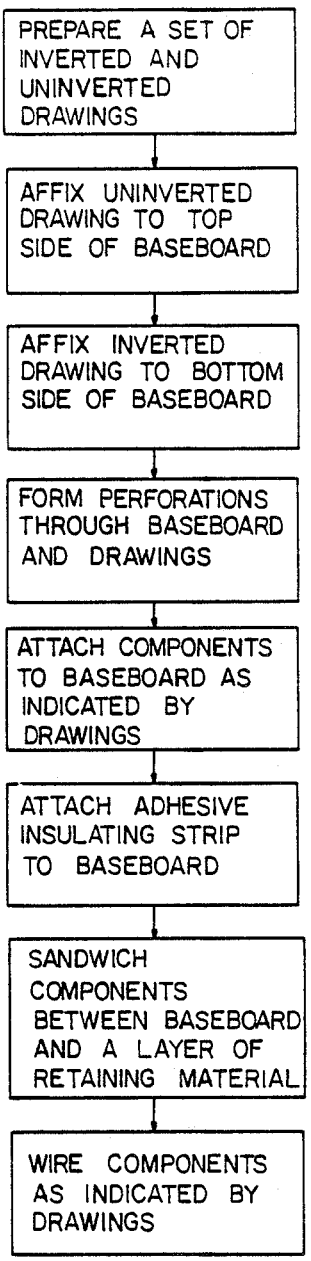
FIG. 9 is a block diagram of a method for assembling a circuit according to the invention.

In accordance with the foregoing, the procedure advanced is initiated with the preparation of the base board. The board is composed of an electrically insulating material, such as cardboard, fibre, plastic, etc. In specific terms, two sheets of paper or similar material are used, with carbon paper placed ink-side upwards under the lower of the sheets to form an inverted or mirror image of the circuit, and the location plan is drawn for the components and their interconnection, according to the electrical circuit required, and based on the corresponding theoretical diagram.

In this way, two symmetrical designs are obtained, the original and its inverted copy. On each of these copies, a number of holes are perforated at defined points of the superimposed drawing. These holes are intended to act as guides for assembly, which is carried out by securing, preferably by adhesion, of the original to one side of the electro-insulating material board. The board is drilled with a punch and a small drill in accordance with the holes made in advance in the paper. Subsequently, some pins having a diameter substantially the same as the holes, are fitted in the holes. The strip with the inverted design is coupled to the other side of the board, on the aforementioned pins and through the holes which have been prepared in it.

In this manner, a basic board is obtained in which both sides show the specific location provided for the different elements and their corresponding connections. In this way they are easily identified, at the same time making simpler the compression of the circuit.

Then the terminals for the different components are inserted in the holes made for them, through the upper face of the base board. This assembly is then placed under a padded body, such as a piece of foam-rubber of similar material, which is the same size as the base board. The padded body acts as a means of retention of the components, making it possible to invert the board as a whole without moving the components.

With the assembly in this inverted position connection tabs can be cut to the appropriate length and the connections made, using the device provided for this operation, with the conductor wire chosen duly loaded. The tip of the wire is pressed onto the board with a small screwdriver or similar element at the point of the first tab selected for connection. The point of the tool or device is made to rotate around the tab, so that the wire is rolled onto it and is secured and duly fixed to it so as to provide good electrical contact which, at the same time, acts as a securing element for the component. The wire is then extended to the following tab, following the connection plan which is defined on the board itself and so on to all those tabs forming a single connection. The wire is cut as close to the first and last connection as possible so as to eliminate loose ends. This operation is repeated until the circuit is completed.

If desired, the electrical contact between wire and tab can be improved by soldering. This must be done in the case of enamel-sheathed wire rather than bare wire.

The base board can now be removed from the foam-rubber and the components will be securely attached, with the circuit ready for connection to a power supply for the performance of the function for which it was designed.

Should it be necessary to modify the circuit, this may be done by cutting the wire at the component chosen, then replacing the component and restoring the connection to its original form.

Should anomalies occur in operation, as is often the case in prototypes and experimental circuits, it is extremely easy to follow through the circuit, on either of the two faces, and make the corresponding measurements and corrections.

In order to make such measurements, as well as any possible connections of elements outside the circuit itself, a special part has been provided, as shown in FIG. 4, comprised of a wire of conductive material, preferably silver-plated copper and having an appropriate diameter for the case. The wire is wound on to a fine rod a number of turns to form a tight spring, while leaving two substantially parallel ends of sufficient length to lock the spring to the base board through holes made for this purpose. The connection thread is introduced through the hollow part defined by the helical winding, and can be tin soldered or tightly pressed with pliers to flatten the terminal/thread assembly so as to make a connection which is correct both electrically and mechanically.

To return to the construction of the baseboard, this can be improved by the placing, on the lower face thereof, a strip of adhesive material, preferably transparent, so that its surface is firmly attached to the base board. The electronic components are then inserted and, when the interconnection is made with the chosen conductor wire, it is fixed to the strip between connection points. The adhesive strip can be fastened onto any material, so that the baseboard can be of any type of material, with no further limitation than that of the previously mentioned character of electro-insulation. If the baseboard is transparent or transluscent, there will be the additional advantage that, as the circuit is visible on both sides, it will not be necessary to draw it on paper, as previously mentioned. In this way the design of the assembly is significantly simplified.

Analysing the device now for the practical application of the procedure, and in accordance with the first example of such practical application, represented in FIGS. 1–3, the device is preferably comprised of a tubular hollow body -1- . Through one end of hollow body 1 there is fitted a nozzle -2- with a small diameter orifice -3- for an emergence of the electrical conductor wire -4- which runs axially through the interior of body -1-. The hollow body 1 is hollow from the rear end thereof and, specifically, from a reel -5-. The reel 5 is fitted so as to rotate freely on a transverse shaft -6- between two lateral lugs -7- outlined on the rear end of body -1- and, more specifically, on a separate part with a neck -8- for insertion in the end of body -1-. This is shown in clear detail in FIG. 2.

On the basis of this extremely simple fundamental structure, the device may be provided with a blade 9 which assists in the cutting of the wire -4-, as shown in FIGS. 5–8.

According to an initial variant of the design, the blade -9-, which can move along one of the generatrices of the body -1-, with its cutting end -10- disposed adjacent the nozzle -3-, may, at its other end -11-, pass through the wall of body -1-, through an opening -12- which is slit along the generatrix. The end -11- is fold fitted to a bushing -13- installed inside the hollow interior of the body -1-, between two opposing springs -14- and -15- which tend to retain the blade -9- in the rest position as shown in FIG. 5. Against the tension, the blade can be moved downward toward the front of the device when a thrust element -16- is activated, suitably guided by a ring -17- installed on body -1- close to the operating end.

In the example of the design which is shown in FIGS. 5 and 6, in which the reel -5- is also fitted so as to turn freely on shaft -6- between the end lugs -7-, there is, inside the throat -8-, a fork -18- which is thrust against the periphery of the reel -5- under the effect of the spring -15-, and which acts as a brake for the reel. The tension on the wire can therefore be suitably adjusted. At the same time, this arrangement regulates the pressure of spring -15- on the fork, by acting on the mount -16- associated with the blade -9- so that the mount -16- has a twin function, i.e., On the one hand, the longitudinal displacement of the blade -9- to make the cut and, on the other, to control the tension on the wire as it emerges from the reel -5-.

According to another variant of the design, as shown in FIG. 7, the blade -9- can be assisted by a single spring 14', outside the body -1-, and installed as an axial extension of the blade, between it and a mounting -19-. There may be no lugs -7- on the body -1- and, inside, on a diametric seating -20-, there can be a reel -5'- now with its axis parallel to that of body -1-. The wire -4- emerges radially through an opening -21- returning to the interior of the body -1- through a second opening -22- which is located between the seating -20- for the reel and the guide nozzle -3- for the said wire -4- during the connection operation. Otherwise the device is of the same design as in the previous cases.

There is a further possibility, as illustrated in FIG. 8, for the aforesaid seating -20- to have a rod -23- emerging, the rear end of which is free and by means of which the reel -5'- can be simply slipped into position. Thus it can rotate on its shaft during the unwinding of the wire which is guided, as in the previous case, through the openings -21- and -22- to the nozzle -3-.

With this emergence of the wire through opening -21- and its return subsequently to the interior of the body -1- through opening -22-, the traction on the reel is a radially directed force, thus facilitating the winding of the wire while, with direct manual pressure on the said wire in this outer path, the tension can be regulated at the connections, so as to be more or less tight, as the operator requires.

What is claimed is:

1. A method of fabricating an electronic circuit comprising the steps of:
   (a) preparing a first drawing of the circuit on a first sheet, and a second drawing on a second sheet which is an inverted copy of the first drawing, by placing the second sheet under the first sheet, and a sheet of carbon paper ink side up under said second sheet, and then drawing the circuit on the first sheet;
   (b) affixing the first sheet with drawing facing outward to the upper surface of an electrically insulating baseboard;
   (c) affixing the second sheet with drawing facing outward to the lower surface of the baseboard in registry with the first sheet;
   (d) forming perforation through the baseboard and first and second sheets at locations where connections are to be made to components constituting the circuit;
   (e) placing said components on said first sheet according to the drawing on the first sheet with their terminals extending through said perforations;
   (f) retaining the components in place by sandwiching them between the first sheet and a layer of resilient retaining material; and
   (g) attaching wires to said terminals in a predetermined pattern according to the drawing on the second sheet to complete the circuit and to secure the components in place.

2. A method as claimed in claim 1 including the step between steps (c) and (g) of providing a fine strip of insulating and adhesive material on the electronically insulating baseboard for retaining the wires in fixed contact with the strip.

3. A method as claimed in claim 2 wherein the strip is transparent.

4. A method of fabricating an electronic circuit comprising the steps of:
   (a) attaching a layout diagram of the circuit to a first side of an electrically insulating baseboard;
   (b) attaching an inverted layout diagram to a second side opposite the first side of the baseboard and in registry with the diagram on the first side;
   (c) perforating the baseboard and diagrams at locations according to the layout diagram where connections are to be made to components constituting the circuit;
   (d) retaining the components on the baseboard at locations indicated by the layout diagrams and baseboard; and
   (e) connecting the terminals in a predetermined pattern as indicated by the inverted layout diagram.

* * * * *